(12) United States Patent
Buchanan et al.

(10) Patent No.: US 9,947,397 B2
(45) Date of Patent: Apr. 17, 2018

(54) CROSSPOINT ARRAY DECODER

(71) Applicant: Hewlett Packard Enterprise Development LP, Houston, TX (US)

(72) Inventors: Brent Buchanan, Palo Alto, CA (US); Yoocharn Jeon, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/329,776

(22) PCT Filed: Sep. 30, 2014

(86) PCT No.: PCT/US2014/058289
§ 371 (c)(1),
(2) Date: Jan. 27, 2017

(87) PCT Pub. No.: WO2016/053296
PCT Pub. Date: Apr. 7, 2016

(65) Prior Publication Data
US 2017/0213591 A1    Jul. 27, 2017

(51) Int. Cl.
*G11C 11/00* (2006.01)
*G11C 13/00* (2006.01)

(52) U.S. Cl.
CPC ........ *G11C 13/0023* (2013.01); *G11C 13/004* (2013.01); *G11C 2013/0054* (2013.01)

(58) Field of Classification Search
CPC ............ G11C 2213/71; G11C 13/0007; G11C 13/0069; G11C 13/0064; G11C 2213/72; G11C 5/02; G11C 13/0023; G11C 2213/32; G11C 17/16; G11C 2013/0073; G11C 2213/31; G11C 13/0026; G11C 2213/34; G11C 11/39

USPC .. 365/148, 51, 230.06, 185.17, 189.16, 203, 365/230.03, 156, 185.05, 185.18, 189.11, 365/189.2, 154, 189.15, 94, 185.11, 185.2
See application file for complete search history.

(56) References Cited

U.S. PATENT DOCUMENTS

| | | |
|---|---|---|
| 6,191,989 B1 | 2/2001 | Luk et al. |
| 6,279,133 B1 | 8/2001 | Vafai et al. |
| 6,347,058 B1 | 2/2002 | Houghton et al. |
| 8,437,171 B1 | 5/2013 | Gilbert |

(Continued)

FOREIGN PATENT DOCUMENTS

| | | |
|---|---|---|
| EP | 1570487 B1 | 4/2008 |
| WO | WO-2004057619 A1 | 7/2004 |

OTHER PUBLICATIONS

International Searching Authority, The International Search Report and the Written Opinion, PCT/US2014/053289, dated Jun. 4, 2015, 12 Pages.

*Primary Examiner* — Thong Q Le
(74) *Attorney, Agent, or Firm* — Hewlett Packard Enterprise Patent Department

(57) ABSTRACT

Example implementations disclosed herein can be used to decode memory elements in a crosspoint array. In one example implementation, crosspoint array decoder includes a number of field effect transistor decoder switches corresponding to specific lines in a crosspoint array and a sense amplifier coupled to at least some of the field effect transistor decoder switches and includes a set of inference field effect transistors matched to the field effect transistor decoder switches to infer a stimulus voltage applied to a memory element in a crosspoint array.

15 Claims, 7 Drawing Sheets

(56) References Cited

U.S. PATENT DOCUMENTS

| | | |
|---|---|---|
| 8,654,600 B1 | 2/2014 | Pollachek |
| 2001/0012228 A1 | 8/2001 | Perner |
| 2004/0233709 A1 | 11/2004 | Tsuchida et al. |
| 2010/0259965 A1* | 10/2010 | Kurjanowicz ......... G11C 17/16 365/94 |
| 2010/0290301 A1 | 11/2010 | Scheuerlein |
| 2013/0016557 A1 | 1/2013 | Kim |

* cited by examiner

CROSSPOINT ARRAY DECODER

BACKGROUND

Crosspoint arrays are structures used to address multiple devices. For example, a crosspoint array can be used to address a collection of individual memory elements in a memory cell. Each memory element can be addressed using a specific configuration of the crosspoint array. Such crosspoint arrays can include parallel bitlines (e.g., columns) crossed by perpendicular wordlines (e.g., rows) with the switching material of the memory element placed between the wordlines and bitlines at various crosspoints. Crosspoint arrays use various types of array decoder switches to selectively couple specific bitline-wordline pairs to appropriate stimulus signals (e.g., voltages or currents) to read, write, set, or form specific memory elements.

DETAILED DESCRIPTION

Various example implementations described herein include inference engine equipped sense amplifiers that can be used to apply precise stimulus voltages to memory elements in crosspoint memory arrays through crosspoint array decoders. In one example, FET-type decoder switches are used to apply stimulus voltages (e.g., set, reset, read-, read-, etc.) to a selected memory element. To apply a precisely controlled stimulus voltage, the FET-type decoder switches can tie both the row and column lines associated with the selected memory element to voltages that can be dynamically adjusted to compensate for the voltage drop across the FETs in the FET-type decoder switches.

In one implementation, one or more of the voltages to which the FET-based decoder switches are coupled can be controlled by a sense amplifier equipped with an inference engine circuit that can infer the voltage levels that the FET-type decoder switches actually apply to the selected memory element. The inference circuit can continually monitor a voltage drop across a set of FETs matched to the FETs in one or more of the FET-type decoder switches to infer the corresponding voltage drop. Based on the inferred voltage drop, the sense amplifier can dynamically and precisely adjust the current that flows through the selected memory element to establish a particular voltage. Such implementations can improve the control over the current applied to resistive memory elements, such as memristors, and allows for improved read and write performance.

In the following detailed description of the present disclosure, reference is made to the accompanying drawings that form a part hereof, and in which is shown by way of illustration how examples of the disclosure can be practiced. These examples are described in sufficient detail to enable those of ordinary skill in the art to practice the examples of this disclosure, and it is to be understood that other examples can be utilized and that process, electrical, and/or structural changes can be made without departing from the scope of the present disclosure.

Figure 1:
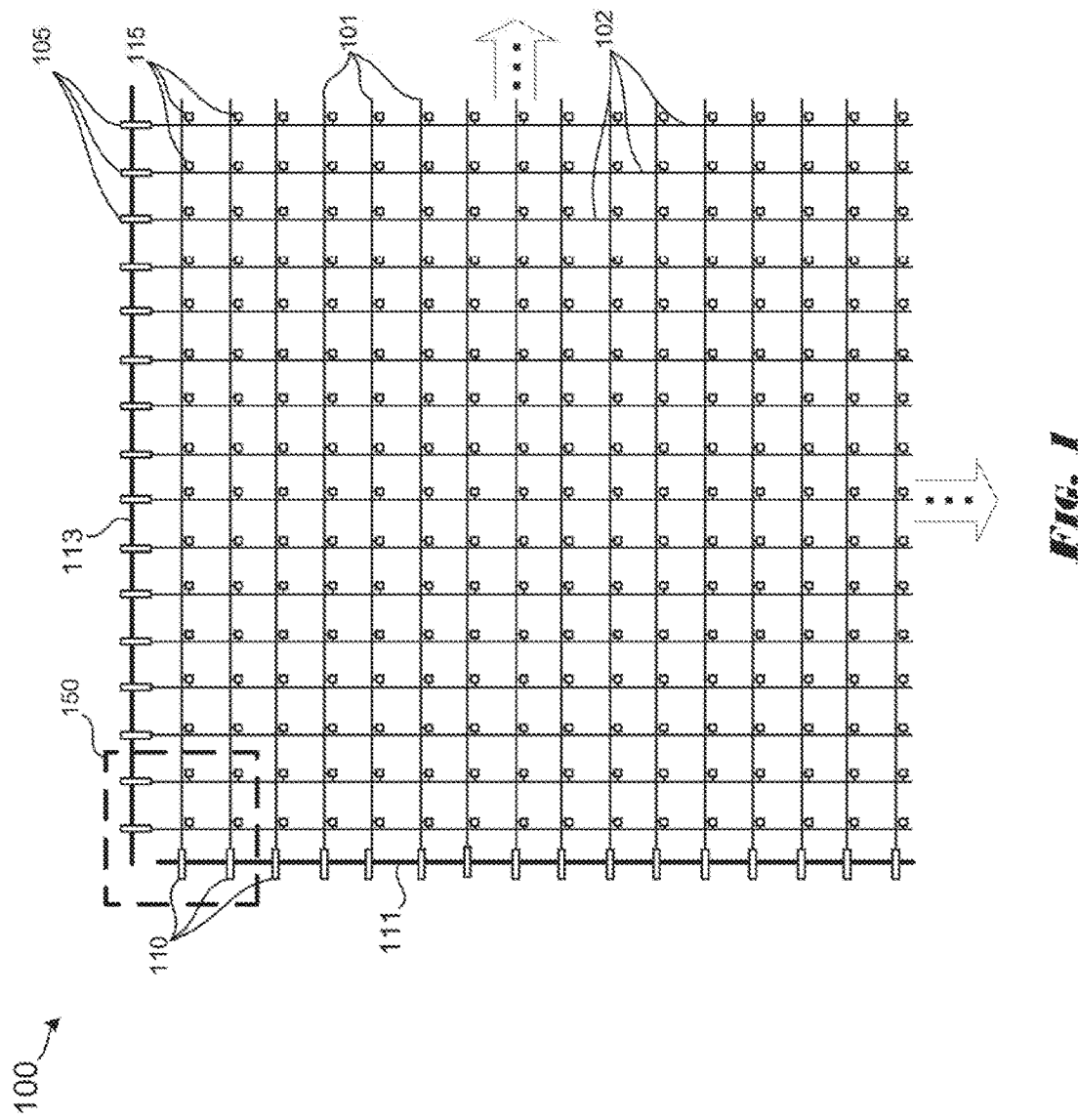
FIG. 1 is a schematic of a portion of a crosspoint array of memory elements h examples of the present disclosure can be implemented.

FIG. 1 depicts a schematic of a portion 100 of a crosspoint array. While only the portion 100 of the particular example crosspoint array is shown, examples of the present disclosure can be scaled to apply to the entire crosspoint array. As shown, the crosspoint array can include multiple rows 101 and multiple columns 102 of conductor lines arranged in a grid or other crosshatch type pattern. Examples of the present disclosure can be applied to addressing memory elements 115 and other devices disposed in crosspoint array type structures.

In various implementations, the rows 101 and columns 102 are disposed in isolated layers of a semiconductor device or package. At each crossover point, the rows 101 and columns 102 can be coupled to one another through a corresponding memory element 115. Each memory element 115 can include any volatile or non-volatile switching material to store one or more bits. Memory elements 115 may also be referred to as a bit cells that can be set to a particular state. For example, a bit cell may be set to one state or another to represent an "on" state or "off" state, otherwise referred to as a "1" or a "0" in binary. In other implementations, given sufficient control over the stimulus voltage applied to the bit cells, more than two states may be possible.

In various resistive memory elements, the resistance state of a particular memory element 115 established during a write can represent a particular memory value. In such examples, the resistance state, which is often also referred to as a resistance value, can vary with the stimulus voltage level established across and/or the resulting current that flows through the memory element. Similarly, during a read, the amount of current flowing through that particular memory element 115 used to determine the memory value depends on the established resistance state and the stimulus voltage applied to memory element 115. Accordingly, as previously described, in resistive memory elements that have sufficient resistance value depth, it is possible to set one of many memory values (e.g., 4 values) by precisely controlling the stimulus voltage during writes and reads to establish or detect the specific resistance states.

In one example, to apply a particular stimulus voltage, a specific element 115 can be addressed using corresponding row switching device 110 and column switching device 105. Addressing a particular memory element 115 may include activating the corresponding switching devices 110 and 105 to couple voltage supply lines 111 and 113 to one or more of the terminals of the memory elements 115 through the corresponding row 101 and column 102. Addressing a particular memory in a crosspoint array is also referred to as decoding the crosspoint array. Accordingly, the row and column switching devices 110 and 105 are also referred to as "decoder switches".

Figure 2:
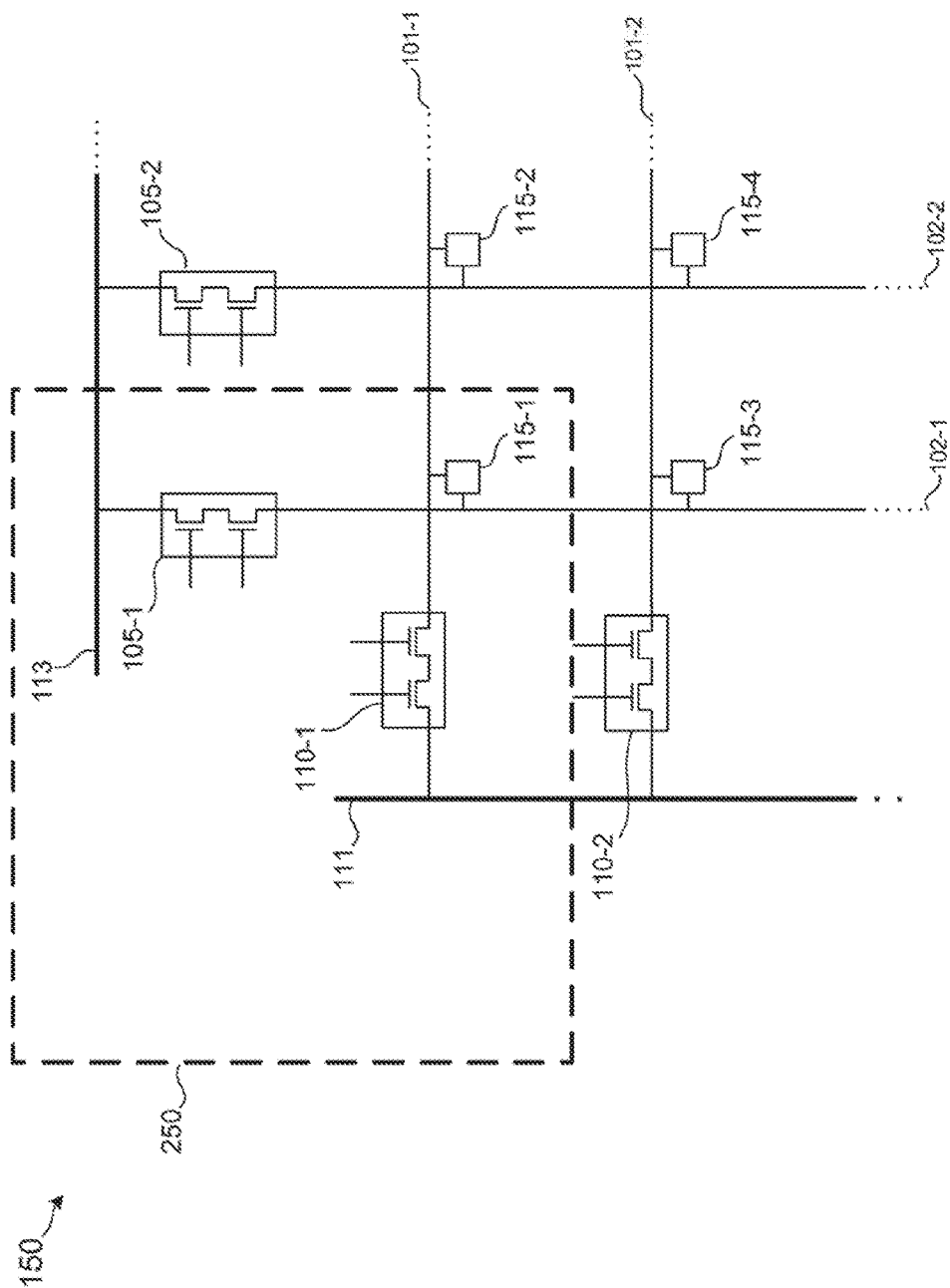
FIG. 2 is a schematic of a subset of field effect transistor (FET) type decoder switches used in a crosspoint array.

FIG. 2 depicts a detailed view of the section 150 of the portion 100 of the crosspoint array. As shown, decoder switches 106 and 110 can be implemented using one or more field effect transistors (FETs). In such example implementations, decoder switches 110 and 105 include FETs 210 and 205, such as NFETs, PFETs, and the like. Such FET-type decoder switches 105 and 110 can be implemented to support current flow in either direction through the selected memory element 115 such that the current path can be symmetrical given the appropriate voltages supplied by the supply lines 111 and 113. In the particular example configuration shown in FIG. 2, each decoder switch 105 and 110 includes two layers of decoding (e.g., FETs 205-1 and 205-2 and FETs 210-1 and 210-2), however, in other example implementations, each of the decoder switches 105 and 110 may include only one FET or can include more than two FETS.

While physical FETs do provide various advantageous performance characteristics (e.g., fast switching speeds) they are not perfect switches. Each FET's channel in a decoder switch will have some non-zero "on-resistance", $R_{On}$. The value of $R_{On}$ of each FET 210 and 205 causes corresponding voltage drops across the decoder switches 110 and 105 and can, thus, affect the voltages that are actually applied to the selected memory element 115 by altering the voltages supplied by supply lines 111 and 113.

Figure 3:
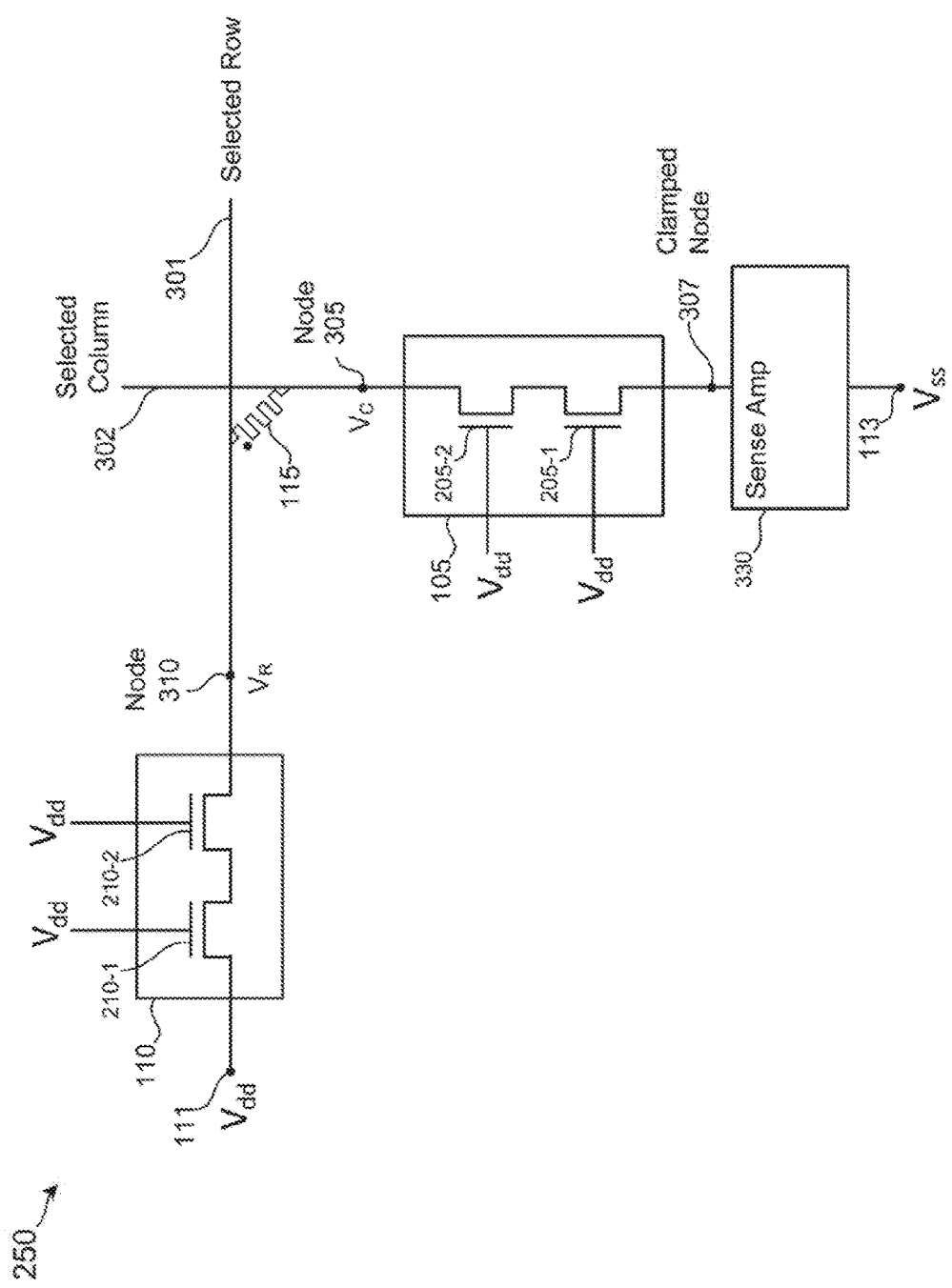
FIG. 3 is a schematic of example FET-type decoder switches in a crosspoint array.

FIG. 3 depicts a detailed view 250 of the section 150 of the portion 100 of a crosspoint array. In the particular example shown in FIG. 3, the decoder for crosspoint array 100 can include a sense amplifier 330 through which $V_{ss}$ from supply 113 can be coupled to a terminal of the FET-type column decoder switch 105 at node 307. $V_{dd}$ from the supply 111 can be coupled to a terminal of the FET-type row decoder switch 110.

In various implementations, the voltages $V_{dd}$ and $V_{ss}$ at nodes 111 and 112 can be very well controlled or clamped by the sense amplifier 334 and other circuits (not shown). However, even when and $V_{ss}$ are precisely controlled, variations and tolerance levels in semiconductor fabrication processes can cause corresponding variations in the characteristics of the FETs 210 and 205 that can cause small, but significant, changes in the voltages that are applied to the selected memory element 115 at nodes 305 and 310.

In many standard semiconductor fabrication processes, electrical characteristics of semiconductor devices can vary ±5% or more under normal conditions. For example, the threshold voltage ($V_T$) and $R_{On}$ of FETs 110 and 105 in FET-type decoder switches 110 and 105 can vary from production run to production run and from production line to production line. Similarly, non-uniformities in the actual semiconductor fabrication equipment can result in spatial variations over the area of the semiconductor substrate, and in some cases, over the area of individual crosspoint arrays. Such variations in the characteristics of the FETs 210 and 105 can cause uncertainty in the values of $V_R$ and $V_C$ applied to the selected memory element 115 at nodes 305 and 310. Due to the electrical characteristics of resistive memory elements and/or the sense amplifier 330, variations in $V_R$ or $V_C$ as small as ±5% can cause significant variations in the amount of time that it takes for the element to change states (e.g., increases in write-time by a factor of 10).

During reads, the variations in $V_R$ or $V_C$ can cause additional complexities. Reading a value for a particular resistive memory element 115 depends on the ability to accurately determine its resistive state. The difference in resistance between a high resistive state, a low resistive, and arty intermediate resistive state, is referred to herein as the "read margin". If the resistive states or all of the resistive memory elements were consistently discrete (e.g., a high resistive state was always one value and a low resistive state was always another value), then the read margin would be consistent across all of the resistive memory elements 115. Unfortunately, this is not the case for many types of resistive memory elements.

The resistive states established when resistive memory elements 115 are stimulated with a specific stimulus voltage will have some distribution from one write to another and from one resistive memory element 115 to another. For example, a resistive memory elements 115 will go to one resistive level when a particular voltage is applied during one write, but can go to another resistive state when the same voltage is applied during another write. As the distribution of possible resistive states widens, the read margin decreases, thus increasing the difficulty of accurately sensing the resistive state of any particular resistive memory element 115. Accurately discerning one resistive state from another requires precise control over the voltages applied to the selected memory element 115 during a read. However, due to the position and variations in FETs 210 and 205, it is difficult to know or control the values of $V_R$ or $V_C$ (e.g., FETs 210 and 205 hide $V_R$ or $V_C$ from direct measurement). This uncertainty in $V_R$ or $V_C$ can limit the ability of the sense amplifier or other circuit to discern memory resistance states with tight read margins. Such limitations on accurate memory state sensing can significantly limit the performance and resulting utility of a crosspoint array of resistive memory elements. Example implementations of the present disclosure improve the read performance of crosspoint arrays of resistive memory elements 115 with small read margins by allowing for precisely controlled known stimulus voltages used to sense the resistive states.

As described above, the positioning and variations in the electrical characteristics of the FETs 210 and 205 in FET-type decoder switches 110 and 105 make it difficult, if not impossible, for conventional sense amplifiers 330 to directly sense or otherwise anticipate the values of stimulus voltages $V_R$ and $V_C$ at nodes 310 and 305. This uncertainty in the values of $V_R$ and $V_C$ at nodes 305 and 310 can result in imprecise control over the stimulus voltages applied to the selected memory element 115. Such imprecision can limit the capabilities of sense amplifier 330 and other circuits to write and/or reed memory elements 115 quickly, safely, and accurately.

In addition, the lack of control over $V_R$ or prevents uniform conditions from bit-cell to bit-cell during memory element operations, thus degrading the SNR during reads and applying variable voltages or currents during writes. Small variations in the voltages $V_R$ or $V_C$ applied to the selected row and column can result in significant variations in the sneak current during both reads and writes. In the case of reads, the sneak current variation degrades the signal-to-noise-ratio and in the case of writes, sneak current variation degrades control of the cell.

Figure 4:
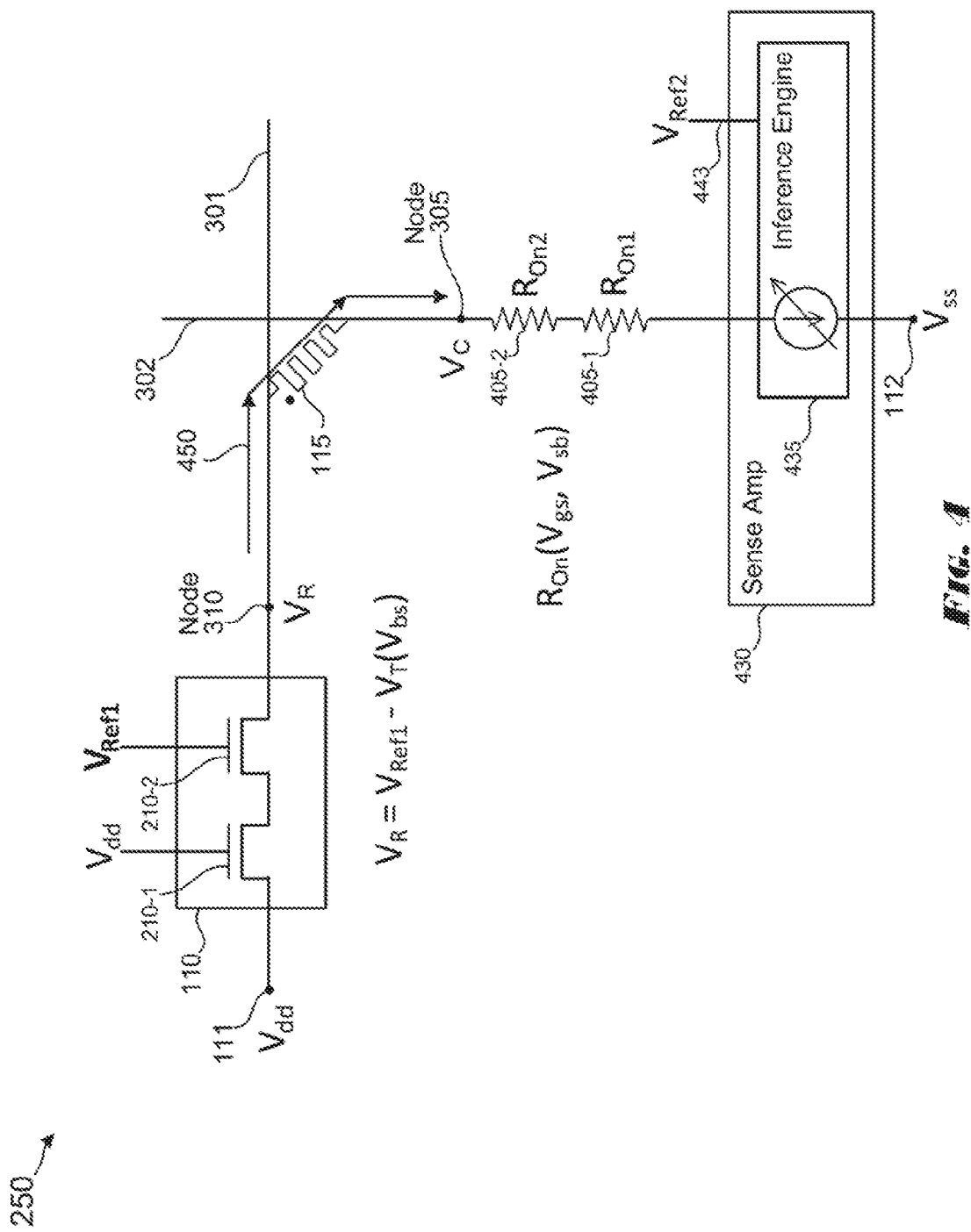
FIG. 4 is a schematic of an example of a selected memory element in a crosspoint array addressed using FET-type decoder switches and an inference engine equipped sense amplifier.

Implementations according to the present disclosure include mechanisms for precisely controlling $V_R$ and $V_C$. In FIG. 4, the drain terminal of FET 210-1 drain terminal is at $V_{dd}$ while the source terminal of FET 205-1 is at the lowest potential in the serial chain. Accordingly, current 450 flows from left to right through the selected row 301, then through the selected memory element 115 in the 'set' direction, then from top to bottom through the selected column 302. Current can flow in the opposite direction as is described below in reference to FIG. 7.

As depicted in FIG. 4, the level of $V_R$ at node 310 of the selected row 30 can be set to a known voltage by using the last tape FET 210-2 as a source follower. In the particular example shown, that gate terminal of FET 210-2 can be driven with a voltage $V_{Ref1}$. Because $V_R = V_{Ref1} - V_T(V_{bs})$, where the threshold voltage $V_T$ of FET 210-2 varies with the bulk-source voltage, $V_{bs}$, of FET 210-2, $V_R$ can be controlled controlling $V_{Ref1}$ used to drive the gate terminal of FET 210-2. In some embodiments, the $V_T$ can be modelled, while in other embodiments $V_T$ can be measured directly.

However, column decoder switch 105 also includes FETs, specifically FETs 205-1 and 206-2, so it not possible to set FET 205-2 as a source follower. With the gates of FETs 205-1 and 205-2 at $V_{dd}$ such that drain-gate voltage, $V_{dg}$, is well above $V_T$, both FETs 205-1 and 205-2 will operate in the ohmic (e.g., linear) region. Consequently, the voltage at $V_C$ will depend on the sum of the channel resistances of FETs 205-1 and 205-2. Accordingly, FETs 205-1 and 205-2 of FIG. 3 are depicted as resistors 405-1 and 405-2 with on resistances $R_{On1}$ and $R_{On2}$ in FIG. 4. The value of each $R_{On}$ is a function of the respective gate-source voltage and the bulk-source voltage (e.g., $R_{On}(V_{gs}, V_{sb})$) of FETs 205-1 and 205-2. In one example implementation, a sense amplifier 430 that includes an inference engine circuit 435 can include circuitry and functionality corresponding to $R_{On1}$ and $R_{On2}$ of FETs 205-1 and 205-2 so that it can adjust the current 460 to set $V_C$ at node 306 to a known voltage.

In many example implementations, a sense amplifier 430 can include various functionality. The sense amplifier 430 can include functionality for enforcing known voltage and/or current conditions on the selected memory element 115. Specifically, sense amplifier 430 can include circuits that force a known voltage across the selected memory element 115. The sense amplifier 430 can also include sensing functionality to detect the state of the selected memory element 115. For example, the sense amplifier can include a circuit that reads the current through the selected memory element 115 while a known voltage is enforced on it. In some implementations the sense amplifier 430 can include an output stage driver and functionality for digitizing the output of the driver.

Figure 5:
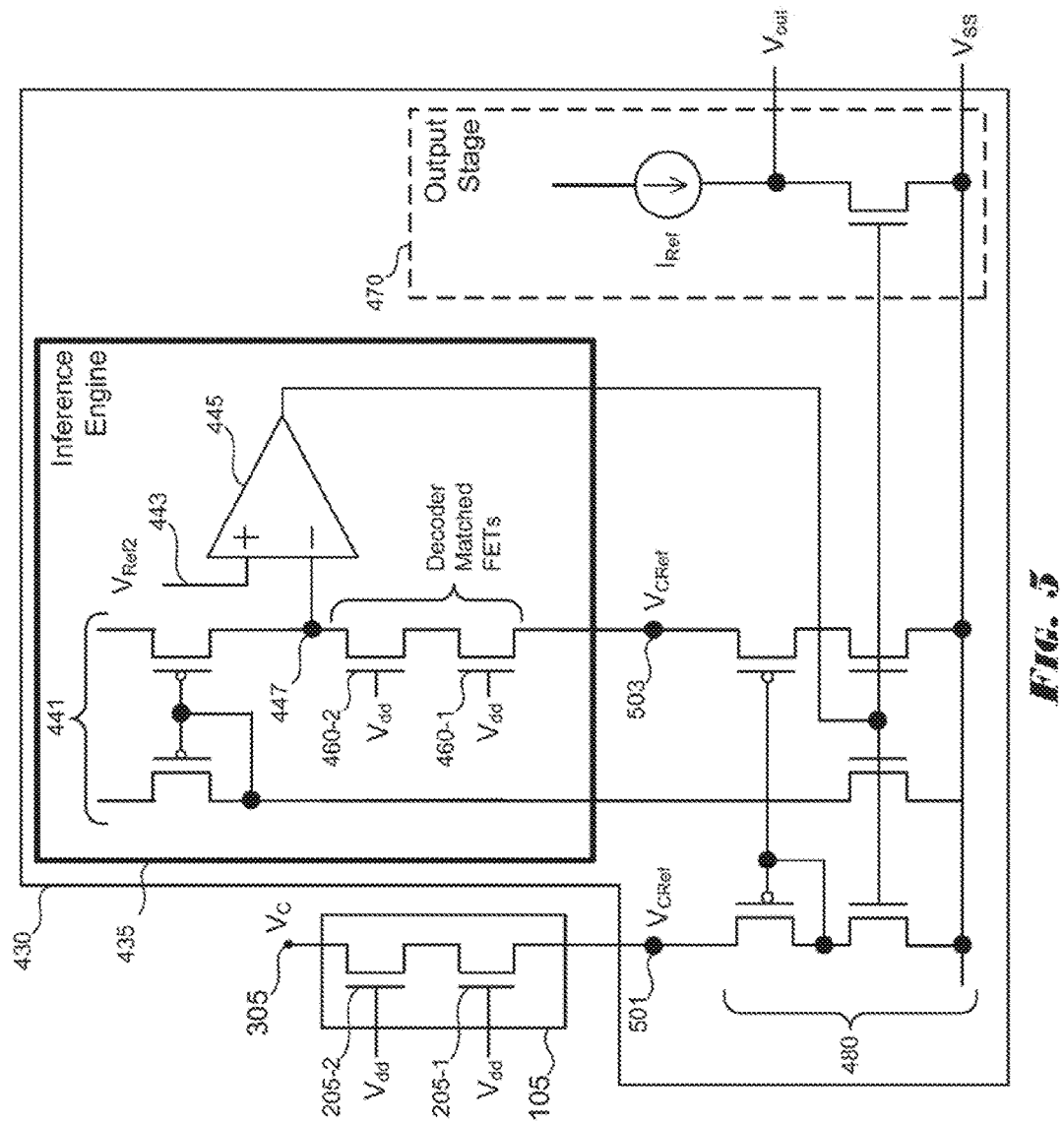
FIG. 5 is a schematic of an example sense amplifier with an inference engine circuit.

FIG. 5 depicts a detailed view of an example sense amplifier 430, according to an implementation of e present disclosure. As shown sense amplifier 430 can include an inference engine 435 to infer the value of $V_C$ at node 305, a current mirror circuit 480 to enforce the value of $V_C$ on a terminal of the selected memory element 115, and an output stage circuit 470 to sense the memory state of the selected memory element 115.

In one example, the inference engine 430 can include an input terminal 443 for receiving a voltage $V_{Ref2}$ to be applied to the selected memory element 115. $V_{Ref2}$ can be set according to characteristics and requirements for reading, writing, and/or forming the selected memory element 115. In the example shown, $V_{Ref2}$ can be coupled to the non-inverting input terminal of a differential amplifier 445. The differential amplifier 445 can then compare the $V_{Ref2}$ to the voltage at node 447 coupled to the inverting terminal and the drain terminal of a set of FETs 460 that match FETs 2-5 in the column decoder switch 105.

In one example, the set of matched FETs 460 can include the same number of FETs, the same type of FETs, the same configuration, and/or formed in the same local manufacturing process as FETs 205 so as to match their electrical characteristics as closely as possible. For ample, when the set of matched FETs 460 are match FETs 205 well, it can be assumed that they will perform similarly, if not exactly the same, under similar operating conditions. Thus, differential amplifier 445 can aim REF_Ref394324560 tage based on the comparison of $V_{Ref2}$ and voltage at node 447 to adjust the current through the current mirror circuits 480 and 441, and the matched FETs 460 until the voltage at node 447 is equal to $V_{Ref2}$.

In the example shown in FIG. 5, current mirror circuit 480 includes a P-mirror that include a number of PFETs and NFETs in one more source-follower configurations to force nodes 501 and 503 to the same voltage (e.g., $V_{CRef}$). With gates of the of FETs 205 and 460 driven with the same voltage (e.g., $V_{dd}$) and the source terminals of FETs 205-1 and 460-1 at $V_{CRef}$, then the voltage $V_C$ at 305 applied to the selected memory element 115 can be inferred to be the same as the voltage $V_{Ref2}$ at node 447 ($V_C = V_{Ref2}$). As such, the voltage $V_C$ that is applied to the selected memory element 115 at node 305 can be precisely controlled by setting $V_{Ref2}$ to the desired voltage level. The output stage circuit 470 can then sense the current through the selected memory element 115 when stimulated with $V_{Ref1} - V_T$ on the row terminal and $V_{Ref2}$ on the column terminal to determine the resistance state.

Figure 6:
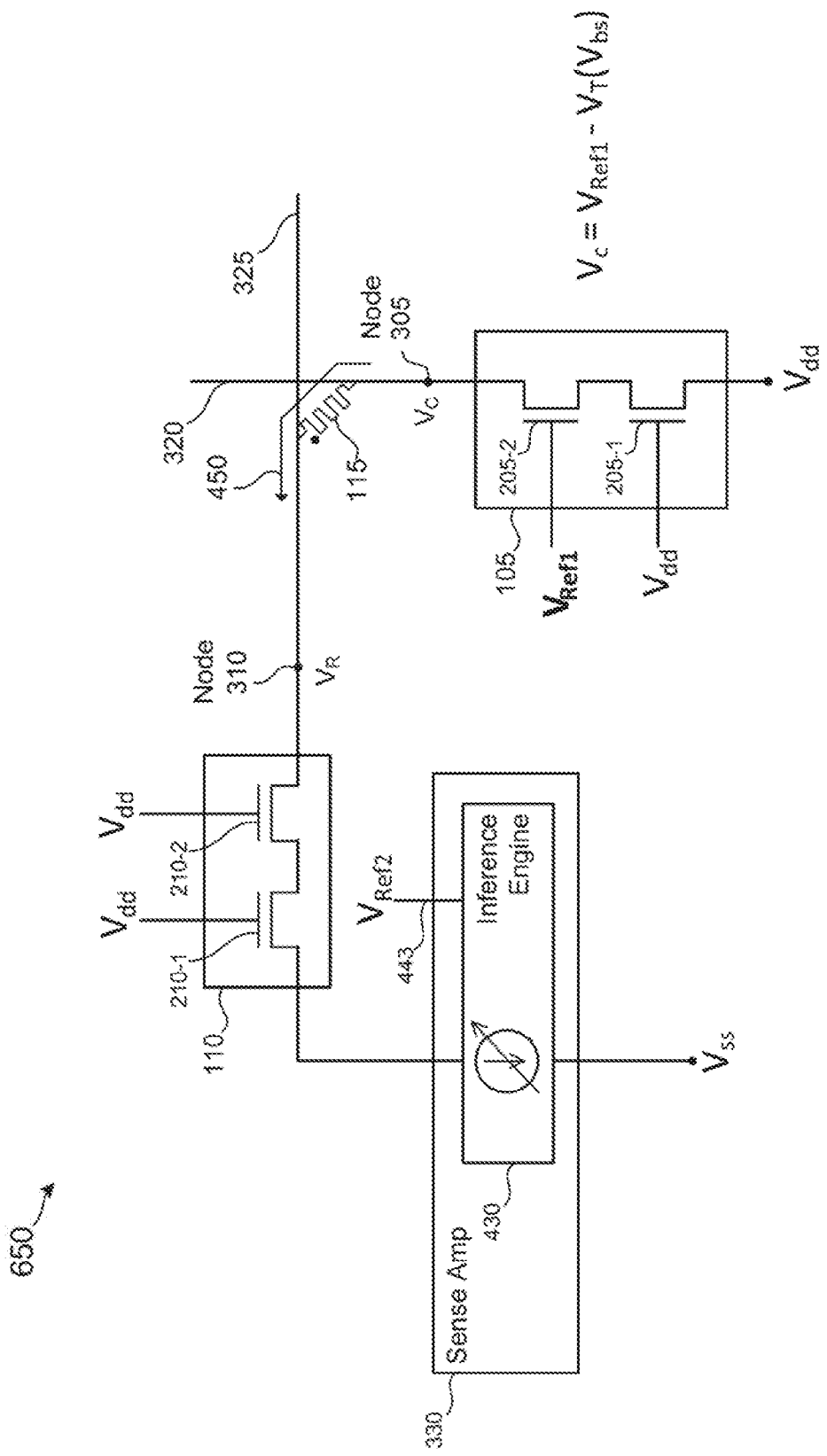
FIG. 6 is a schematic of an example of a selected memory element in a bidirectional crosspoint array addressed using FET-type decoder switches and inference engine equipped sense amplifier.

In implementations in which the FETs 210 and 205 are NFETs, the current can be sent through the selected memory element 115 in either direction (e.g., the configuration of FIG. 3 is bidirectional). In such implementations, the sense amplifier 430 can be coupled to the row decoder switch 110, as shown as portion 650 of a crosspoint array in FIG. 6. The operation of the will be similar to that described above in reference to FIG. 5, but instead of FETs 210 of the row decoder switch 110 configured as source-followers to control $V_R$, $V_R$ is controlled by the inference engine 430 in response to $V_{Ref2}$ with $V_{SS}$ and $V_{dd}$ reversed relative to the configuration shown in FIG. 3. As such, $V_C$ is controlled by operating FET 205-2 as a source-follower in response to $V_{Ref1}$ driving its gate.

Figure 7:
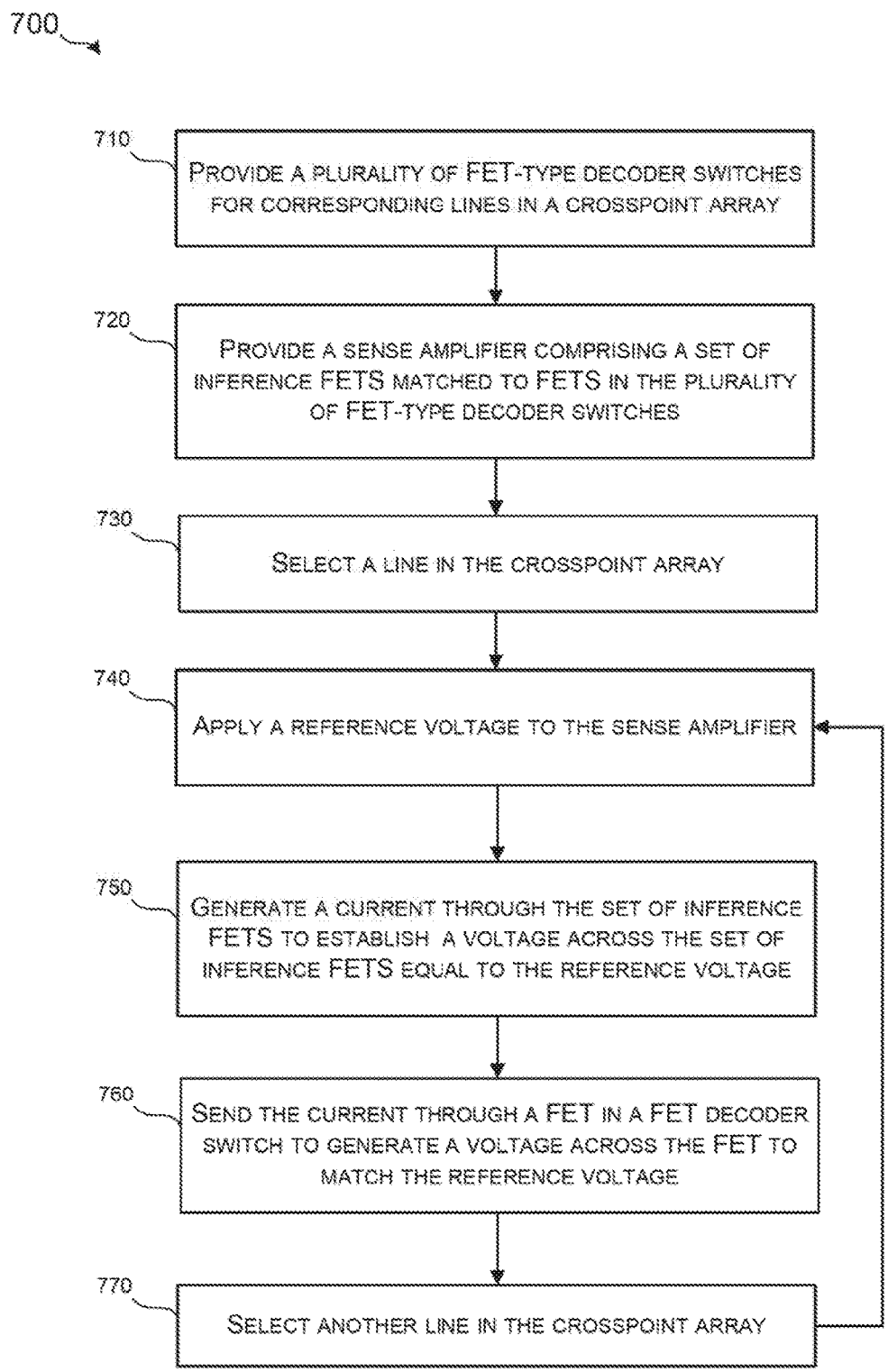
FIG. 7 is a flowchart of a method for addressing a crosspoint array according to various examples.

FIG. 7 is a flowchart of a method 700 for controlling a stimulus voltage on a selected memory element 115 in a cross point array using an inference engine 435 that includes a set of inference FETs 460 that match the FETs 210 or 205 in a FET-type decoder switch. The method can begin at box 710 by providing number of FET-type decoder switches for corresponding lines. (e.g., rows and/or columns) in a crosspoint array. At box 720, one or more sense amplifiers 430 are provided that include a set of FETs 460 that match FETs in some or all of the FET-type decoder switches.

At box 730, one of the lines in the crosspoint array is selected. In one example, the lure n include a row and/or a column in a crosspoint array associated with a selected memory element 115.

At box 740, a reference voltage can be supplied to the sense amplifier 430. The reference voltage can be set according the electrical characteristics of the selected memory element and/or the requirements of the desired functionality. For example, the reference voltage can be one value for reads, another value for writes, and yet another value for forming the memory element.

At box 750, the sense amplifier 430 can be used to generate a current through the set of inference FETs 460 to establish a voltage that matches the reference voltage. In one implementation, this voltage is achieved using a differential amplifier 445 and a one or more current mirror circuits. The current can then be sent to through one or more FETs in the FET-type decoder switch to generate voltage across the FET-type decoder equal to the reference voltage, at box 760. At box 770 another line in the crosspoint array can be selected and boxes 740 through 760 can be repeated.

According to the foregoing, examples disclosed herein enable FET based decoder switches to provide more of the available voltage (e.g., the drain voltage) to the selected memory element 115 instead of losing it across decoder FETs, making more voltage available for forming, switching, and reading the selected memory elements 115.

These and other variations, modifications, additions, and improvements may fall within the scope of the appended claims(s). As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

What is claimed:

1. A crosspoint array decoder comprising:
   a plurality of field effect transistor decoder switches corresponding to specific lines in a crosspoint array; and
   a sense amplifier coupled to at least some of the plurality of field effect transistor decoder switches and comprising a set of inference field effect transistors corresponding to the at least some of the plurality of field effect transistor decoder switches to infer a precisely controlled stimulus voltage applied to a memory element in a crosspoint array.

2. The crosspoint array decoder of claim 1, wherein the set of inference field effect transistors are matched to sets of decoder field effect transistors in the at least some of the plurality of field effect transistor decoder switches to simulate the stimulus voltage.

3. The crosspoint array decoder of claim 2, wherein the stimulus voltage is simulated by sensing a voltage drop across the set of inference field effect transistors when conducting a first current equivalent to a second current flowing through at least one of the sets of decoder field effect transistor.

4. The crosspoint array decoder of claim 1, wherein the sense amplifier further comprises a current mirror circuit to generate a current that can be used to generate the stimulus voltage based on a reference voltage and the set of inference field effect transistors.

5. The crosspoint array decoder of claim 1, wherein the lines in the crosspoint array comprise rows and columns of the crosspoint array, and each of the at least some of the plurality of the field effect transistor decoder switches are coupled to either a corresponding row or a corresponding column.

6. A method comprising:
   providing a plurality of field effect transistor decoder switches for corresponding lines in a crosspoint array;
   providing a sense amplifier comprising a set of inference field effect transistors matched to field effect transistors in the plurality of field effect transistor decoder switches;
   selecting a line in the crosspoint array;
   applying a reference voltage to the sense amplifier;
   generating a current through the set of inference field effect transistors to establish a first voltage across the set of inference field effect transistors to match the reference voltage; and
   sending the current through at least one field effect transistor in a field effect transistor decoder switch corresponding to the selected line to generate a second and precisely controlled voltage across the at least one field effect transistor to match the reference voltage.

7. The method of claim 6 further comprising applying the second voltage to a memory on the selected line in the crosspoint array.

8. The method of claim 6, wherein the second voltage and the reference voltage are maintained within ±5% of one another.

9. A sense amplifier for a clamping decoder of a crosspoint array comprising:
   a first terminal to receive a drain voltage;
   a second terminal to receive a reference voltage;
   a plurality of inference field effect transistors corresponding to a plurality of decoder field effect transistors in the clamping decoder, each of the plurality of inference field effect transistors having a gate terminal coupled to the first terminal; and
   a differential amplifier having a first input terminal coupled to the second terminal, a second input terminal coupled to the plurality of inference field effect transistors, and an output terminal coupled to the plurality of decoder field effect transistors to generate a current through the plurality of decoder field effect transistors in response to the reference voltage, the drain voltage, and the plurality of inference field effect transistors.

10. The sense amplifier of claim 9 wherein passing the current through at least one of the plurality of decoder field effect transistors results in a stimulus voltage that matches the reference voltage.

11. The sense amplifier of claim 9, wherein the stimulus voltage is equal to the reference voltage.

12. The sense amplifier of claim 9, wherein the plurality of inference field effect transistors and the output terminal of the differential amplifier are coupled to the decoder field effect transistors through a current mirror circuit.

13. The sense amplifier of claim 9, wherein the plurality of inference field effect transistors match the plurality of decoder field effect transistors.

14. The sense amplifier of claim 9, further comprising an output stage circuit to sense the current through a memory element coupled to the decoder field effect transistors.

15. The sense amplifier of claim 9 wherein the number of inference field effect transistors in the plurality of inference field effect transistors is equal to the number of decoder field effect transistors in the plurality of decoder field effect transistors.

* * * * *